(12) United States Patent
Ansari et al.

(10) Patent No.: US 7,958,414 B1
(45) Date of Patent: Jun. 7, 2011

(54) ENHANCING SECURITY OF INTERNAL MEMORY

(75) Inventors: Ahmad R. Ansari, San Jose, CA (US); Ting Lu, Austin, TX (US); Ismed D. Hartanto, Castro Valley, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 12/888,317

(22) Filed: Sep. 22, 2010

(51) Int. Cl.
  *G01R 31/28* (2006.01)
  *G11C 29/00* (2006.01)
  *G11C 7/00* (2006.01)
  *H03K 19/00* (2006.01)
  *G06F 7/38* (2006.01)

(52) U.S. Cl. ........ 714/718; 714/719; 714/725; 365/201; 365/222; 326/8; 326/39

(58) Field of Classification Search .................. 714/718, 714/719, 725; 365/201, 222; 326/8, 39
See application file for complete search history.

(56) References Cited

U.S. PATENT DOCUMENTS

| | | | |
|---|---|---|---|
| 7,024,551 B2* | 4/2006 | King et al. | 713/2 |
| 7,174,489 B2* | 2/2007 | Sadakata et al. | 714/719 |
| 7,373,437 B2* | 5/2008 | Seigneret et al. | 710/22 |
| 7,397,719 B2* | 7/2008 | Takahashi et al. | 365/222 |
| 2005/0105357 A1* | 5/2005 | Oh | 365/222 |
| 2010/0194956 A1* | 8/2010 | Yuan et al. | 348/308 |

OTHER PUBLICATIONS

Sunwoo et al., Built-In Self-Test of Configurable Cores in SoCs Using Embedded Processor Dynamic Reconfiguration, 2005, Proc. International SoC Design Conf., pp. 174-177.*
Nass, Rich, "Xilinx puts ARM Core into its FPGAs", EE Times, 2 pp., Apr. 27, 2010 available at http://www.eetimes.com/electronics-products/processors/4115523/Xilinx-puts-ARM-core-into-its-FPGA.

* cited by examiner

*Primary Examiner* — John J Tabone, Jr.
(74) *Attorney, Agent, or Firm* — W. Eric Webostad

(57) ABSTRACT

An embodiment of a method of enhancing security of internal memory is disclosed. For this embodiment of the method, the application specific block is operated in a functional mode, and a reset of the application specific block is initiated. From a built-in self-test engine, at least one write to the internal memory is initiated in response to the reset initiated, where the at least one write overwrites data stored in the internal memory during a reset mode.

20 Claims, 5 Drawing Sheets

ENHANCING SECURITY OF INTERNAL MEMORY

FIELD OF THE INVENTION

An embodiment of the invention relates to integrated circuit devices ("ICs"). More particularly, an embodiment of the invention relates to enhancing security of internal memory of an application specific block.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Application integrated circuits, whether stand alone circuits or embedded circuits, namely "application specific blocks", conventionally include internal memory, such as, for example, internal random access memory. Conventionally, a secure system having such an application specific block with internal random access memory is cleaned of retained data before the system starts. This may be a time consuming process performed by software. However, in some instances it may not be possible for software to clean internal random access memory, whether mapped or unmapped memory. It should be understood that FPGA internal memory structures can all be cleared after reset.

It should further be understood that conventional ASIC blocks have built-in self-test blocks or engines for testing internal random access memory during a test mode, as is performed by a manufacturer of such ASIC block. More recently, "Intellectual Property" ("IP") cores may be licensed from one company to another company to include in their ASIC or to be included in a system on chip ("SoC"). Conventionally, licensors of cores will allow for an internal random access memory interface to be extended for access for testing in a test mode. Not all licensed cores have built-in self-test ("BIST") engines, and thus the ability to access a RAM interface directly facilitates such testing in a test mode.

Due to limitations of securing ASIC blocks, including one or more ASIC blocks of a system, with respect to potentially sensitive data still present in an internal RAM, it would be desirable and useful to provide a less time consuming and potentially more thorough "cleaning" of such data.

SUMMARY OF THE INVENTION

One or more embodiments generally relate to enhancing security of internal memory of an application specific block.

An embodiment relates generally to a method of enhancing security of internal memory of an application specific block. In such an embodiment, the application specific block is operated in a functional mode. A reset of the application specific block is initiated. From a built-in self-test engine, at least one write to the internal memory is initiated in response to the reset initiated, where the at least one write overwrites data stored in the internal memory during a reset mode.

Another embodiment relates generally to a method for securing a system having an application specific integrated circuit with an internal memory. In such an embodiment, a reset of the system is initiated. A reset mode of the application specific integrated circuit is initiated responsive to the reset of the system. Initiated, by a built-in self-test engine associated with the application specific integrated circuit, are writes to the internal memory, where the writes overwrite data stored in the internal memory during the reset mode.

An embodiment of an integrated circuit includes an application specific integrated circuit block that has internal memory. A built-in self-test engine is coupled to the internal memory. A reset block is coupled to the application specific integrated circuit block and the built-in self-test engine, where the reset block causes the built-in self-test engine to overwrite data in the internal memory in a reset mode.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 1 is a simplified block diagram depicting an exemplary embodiment of a columnar Field Programmable Gate Array ("FPGA") architecture in which one or more aspects of the invention may be implemented.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
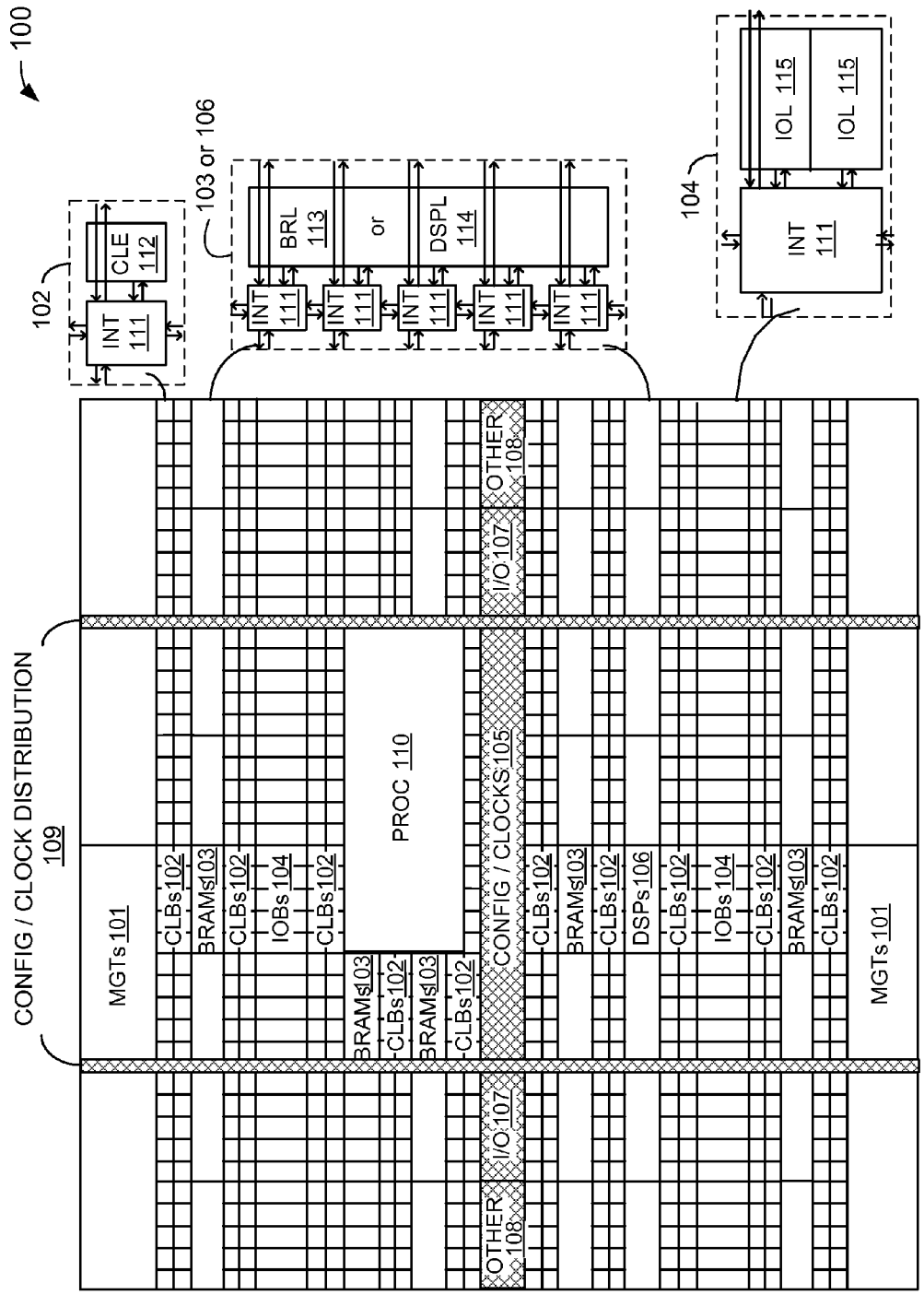

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several rows of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
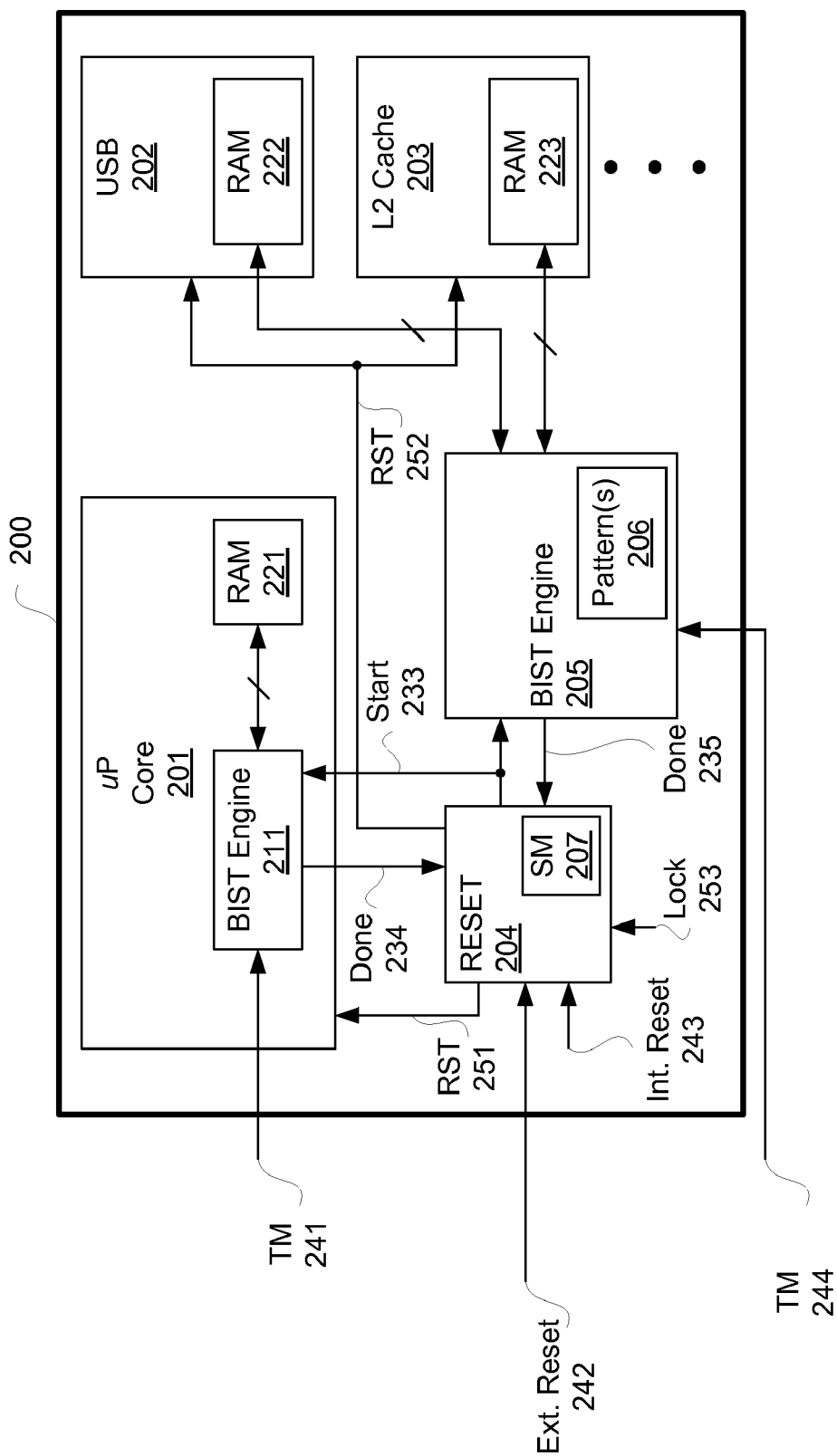
FIG. 2 is a block diagram depicting an exemplary embodiment of an integrated circuit.

FIG. 2 is a block diagram depicting an exemplary embodiment of an integrated circuit 200. Integrated circuit 200 may be a standalone ASIC, a host integrated circuit with ASIC blocks, an SoC with ASIC blocks, or other integrated circuits with ASIC blocks. For purposes of clarity by way of example and not limitation, it shall be assumed that integrated circuit 200 is an FPGA, such as FPGA 100 of FIG. 1, with one or more ASIC cores. However, again, it should be understood that any of a variety of integrated circuits having ASIC circuitry as described herein may be used.

Integrated circuit 200 includes a microprocessor core 201, and peripheral cores 202 and 203. Even though two peripheral cores 202 and 203 are illustratively depicted, it should be understood that more or fewer than two peripheral cores may be present in integrated circuit 200. Furthermore, even though a microprocessor core 201 is illustratively depicted, it is not necessary that such microprocessor core 201 be present. Again, integrated circuit 200 is just an example of a possible configuration, and many other possible ASIC blocks other than those illustratively depicted or in addition to those illustratively depicted, may be used.

In this example embodiment, peripheral ASIC block 202 is a universal serial bus ("USB") core 202, and peripheral ASIC core 203 is a level two ("L2") cache core 203. Microprocessor core 201 includes a BIST engine 211 and internal memory such as, e.g., RAM 221 coupled to BIST engine 211. USB core 202 includes internal RAM 222, and L2 cache core 203 includes internal RAM 223. Writing to internal memory is described below as writing to internal RAM for purposes of clarity by way of example and not limitation. However, it should be understood that internal memory other than internal RAM, whether volatile or non-volatile, may be used. More generally, any internal memory having an array of cells structure may be used.

It should be understood that a BIST engine, such as BIST engine 205 or 211 for example, may have a standard interface, such as a JTAG interface for example, or may have a proprietary interface. A manufacturer may use a test mode signal, such as test mode signal 241, provided to BIST engine 211 for testing internal RAM 221. Likewise, a manufacturer may provide a test mode signal 244 to BIST engine 205 for testing internal RAMs 222 and 223. BIST engines, such as BIST engines 205 and/or 221 are memory BIST engines.

Test modes may include running various patterns of bits into associated RAMs for testing the operability of cells in such RAMs. In some instances, a defective cell may have its address mapped to another address associated with another set of cells, such as by programming electrically programmable fuses or other programmable devices. Rerouting addresses to mask off defective addresses due to one or more defective cells associated with such addresses uses test mode signal paths, which may be different from functional or operational signal paths. Accordingly, a test mode, which identifies defective cells and their location, and may be used for rerouting addresses, is distinctly different from a functional mode, namely a normal operating mode, of integrated circuit 200.

For the following description, it will be assumed that test mode signals 241 and 244 are not asserted, and assumed that integrated circuit 200 has been put in a functional mode. During such functional mode of operation, it shall be assumed that integrated circuit 200 may have data, which may include sensitive data, stored in one or more of RAMs 221, 222, and 223. It shall further be assumed that functional paths are used to perform writes to RAMs 221, 222, and 223 from associated BIST engines during a reset mode.

As described below in additional detail, a reset operation may be initiated responsive to an event, examples of which are described below in additional detail. Such reset may be used to trigger "cleaning" RAMs 221 through 223. By the word "clean," it should be understood that not all bits necessarily have to be written over one or more times in order to destroy any possible trace of data previously stored in RAMs 221 through 223, though this may be a protocol used; however, for purposes of clarity by way of example and not limitation, it shall be assumed that writing a data pattern, whether the same data pattern is written to all RAMs or not, is sufficient for corrupting any retained data in RAMs 221 through 223 such that it is sufficiently secure or "cleaned."

Reset of integrated circuit 200 may be initiated by asserting an external reset signal 242 provided to reset block 204 of integrated circuit 200, or by asserting an internal reset signal 243 provided to reset block 204. Reset block 204 may include a state machine ("SM") 207 which stores states for a reset mode protocol. It should be understood that there may be a particular sequence of signals in order for a reset to be performed properly, namely an order of resetting blocks and an order of releasing reset of such blocks.

Reset block 204 may provide reset signal 251 to microprocessor core 201, and may provide reset signal 252 to USB core 202 and L2 cache core 203. More particularly, signals 251 and 252 may be asserted to hold cores 201 through 203 in a reset condition. Whether core 201 is put in such a reset condition prior to, after, or at the same time as cores 202 and 203 may be part of the reset protocol.

With cores 201 through 203 held in a reset condition or mode, reset block 204 may assert start signal 233 as provided to BIST engine 211 and BIST engine 205. BIST engine 211 initiates one or more writes to RAM 221 responsive to start signal 233, and BIST engine 205 initiates one or more writes to RAMs 222 and 223 responsive to start signal 233.

It should be understood that a BIST engine 211 may be programmed with or have access to one or more bit patterns, such as BIST engine 205 have access to bit patterns 206. Thus for example, BIST engine 205 may select one or more BIST patterns 206 for writing to RAMs 222 and 223. Optionally, a BIST engine 211 may be programmed to perform complete writes of all data 0s or all data 1s, or a sequence of all data 1s and all data 0s to RAM 221. The degree of writing cycles may be dependent upon the application, namely the level of security to be invoked.

It should be appreciated that BIST engines 211 and 205 may already be present in integrated circuit 200. For example, a core, such as microprocessor core 201 may be licensed from a third party for use by a manufacturer of integrated circuit 200. Such licensed core may include a BIST engine and internal RAM, such as BIST engine 211 and internal RAM 221. Accordingly, such BIST engine is present in a baseline configuration of integrated circuit, and thus such BIST engine does not need to be added for "cleaning" internal RAM 221 as described herein. Thus the ability to access such BIST engines to perform writes to internal RAM during a reset mode not only allows for highly parallel capability for writing to internal RAM, due to the number of internal BIST engines present, but also allows access to internal RAM at a deeper level than may be available to a CPU executing a software program. Thus not only may "cleaning" time be reduced due to having multiple BIST engines in parallel perform writes, and where such engines are in hardware not software, but also such BIST engines may have access to internal RAM that is mapped and internal RAM that is unmapped, where software executing on a processor may not have such access with respect to unmapped memory.

State machine 207 may be used to have an initial reset state, to transition to a state to start BIST engines to initiate a "clean" of internal RAMs, and to transition to a state to release reset after receipt of a done signal and optionally a lock signal. It should be understood that BIST engines, such as BIST engines 211 and 205, provide signals upon completion. In other words, BIST engines operating in a test mode provide indications of whether circuits pass or fail, failed addresses, and a completed or done signal with respect to writing a pattern or patterns. Accordingly, such done signaling may be used to indicate whether a write to internal RAM has been completed for purposes of a "clean."

Accordingly, done signal 234 may be asserted by BIST engine 211 as provided to reset block 204 in response to completion of a write cycle to internal RAM 221. Likewise, done signal 235 may be asserted by BIST engine 205 as provided to reset block 204 in response to completion of write cycles to internal RAMs 222 and 223. State machine 207 upon receiving done signals 234 and 235 may transfer state to a release reset state.

Additionally, it should be understood that a phase-locked loop ("PLL") lock signal 253 may be used as part of a reset protocol. Such a lock signal 253 may provide an indication that a clock output of a PLL that is used for internal clocking is stable. Optionally, lock signal 253 may be asserted for an artificial lock condition. Accordingly, state machine 207 optionally may be configured to determine whether a lock signal 253 has been asserted before allowing reset block 204 to release bit signals 251 and 252.

A last state of state machine 207 may be to release reset signals 251 and 252, namely de-assert those signals to allow their associated cores to be released from a reset mode. Again, the sequence of de-asserting reset signals, such as reset signals 251 and 252 may be part of a reset protocol. The level of "cleanness" of RAMs 221 through 223 may vary depending on level of security used. In a less secure system, state machine 207 may be configured to wait only long enough for a "deepest" memory instance of internal RAM to finish one write cycle before de-asserting start signal 233 as applied to BIST engines 211 and 205. However, once done signals 234 and 235 have both been asserted as provided to reset block 204, state machine 207 may cause start reset block 204 to de-assert start signal 233 and de-assert reset signals 251 and 252. Thus it should be understood that when integrated circuit 200 comes out of a reset mode, all internal instances of RAM may have been "cleaned."

Figure 3:
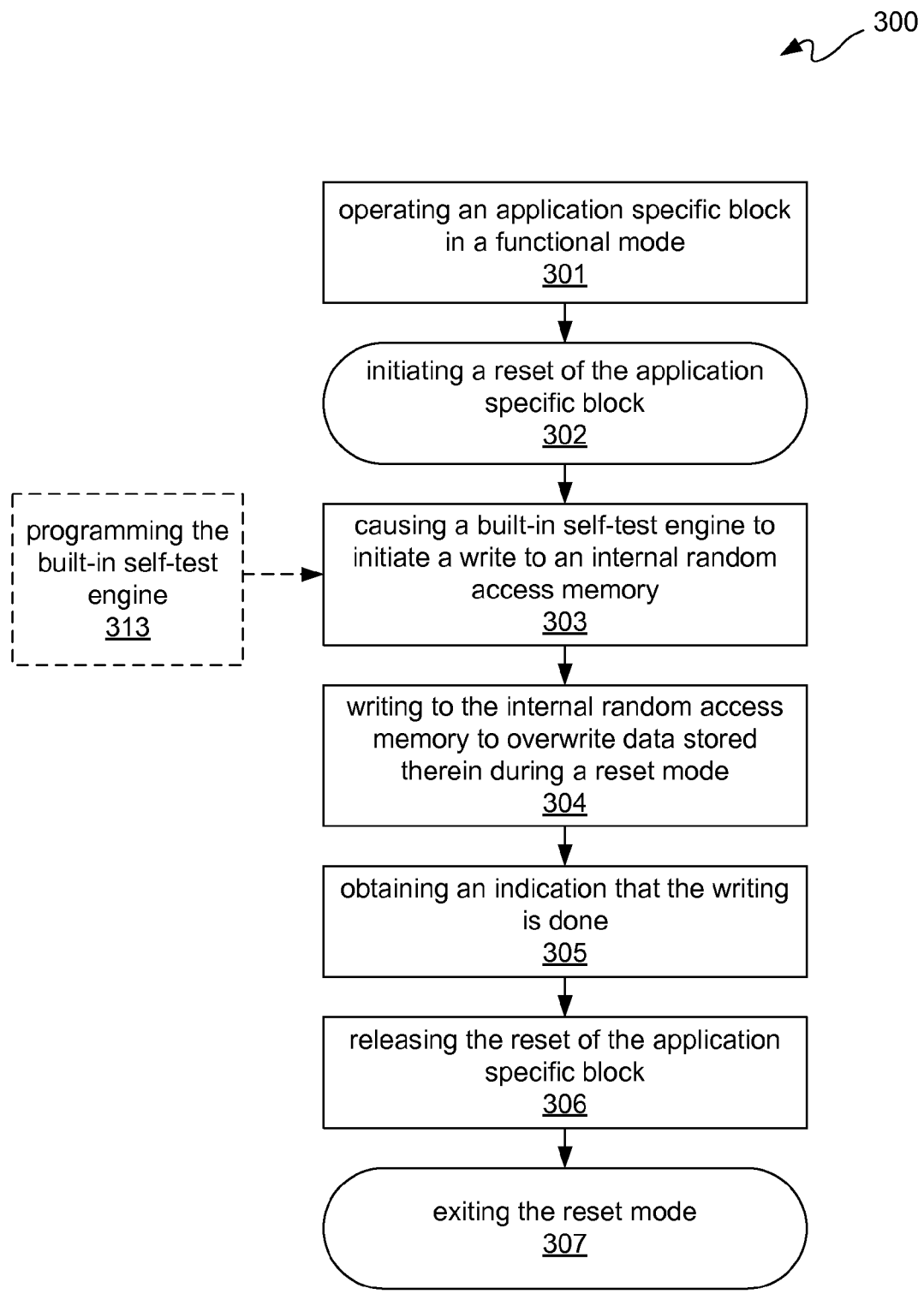
FIG. 3 is a flow diagram depicting an exemplary embodiment of a process for enhancing security of internal random access memory of an application specific block.

FIG. 3 is a flow diagram depicting an exemplary embodiment of a process 300 for enhancing security of internal random access memory of an application specific block. To reiterate, such application specific block may be within a host integrated circuit or may be a stand alone integrated circuit.

At 301, an application specific block is operated in a functional mode. It should be understood that by operating in such a functional mode, data may be stored in internal RAM of such application specific block.

At 302, a reset of such application specific block is initiated. At 303, a BIST engine initiates at least one write, which for example may be a sequence of writes, to internal random access memory in response to initiation of the reset at 302. Optionally, such BIST engine may be programmed to access a pattern at 313 for writing to internal random access memory at 303, as previously described. Furthermore, as previously described, optionally all data 0s or all data 1s, or a combination of writes of both, may be preprogrammed into such BIST engine at 313. Such programming at 313 may be done previously by a manufacturer or hard coded for writing to internal random access memory as part of a test mode. However, again, it should be understood that process 300 is not for a test mode, but for a reset out of a functional mode.

At 304, the internal random access memory is written to overwrite data stored in such internal random access memory during such reset mode. It should be appreciated that not every bit of data need be overwritten, but every bit of data may be overwritten, as may vary from application to application depending on the level of security to be used. It should further be understood that writing at 304 during a reset mode uses paths associated with a functional mode. In other words, if internal RAM has already been masked to avoid one or more addresses, some functional paths used may be masked for accessing such internal RAM. Accordingly, it should be understood that there may be a distinction between paths used during a reset mode associated with functional operation in comparison to paths used during a test mode.

At 305, an indication that the writing performed at 304 is completed is obtained. At 306, responsive to attaining such indication, the reset asserted is released. More particularly, the application specific block having been held in a reset state or mode is released from such reset state or mode, and at 307, such application specific block exits the reset mode.

Thus, for example, if such application specific block were a CPU, when such CPU came out of or was released from a reset mode, system memory internal to such CPU would have been "cleaned" by one or more writings to internal RAM performed at 304.

Figure 4:
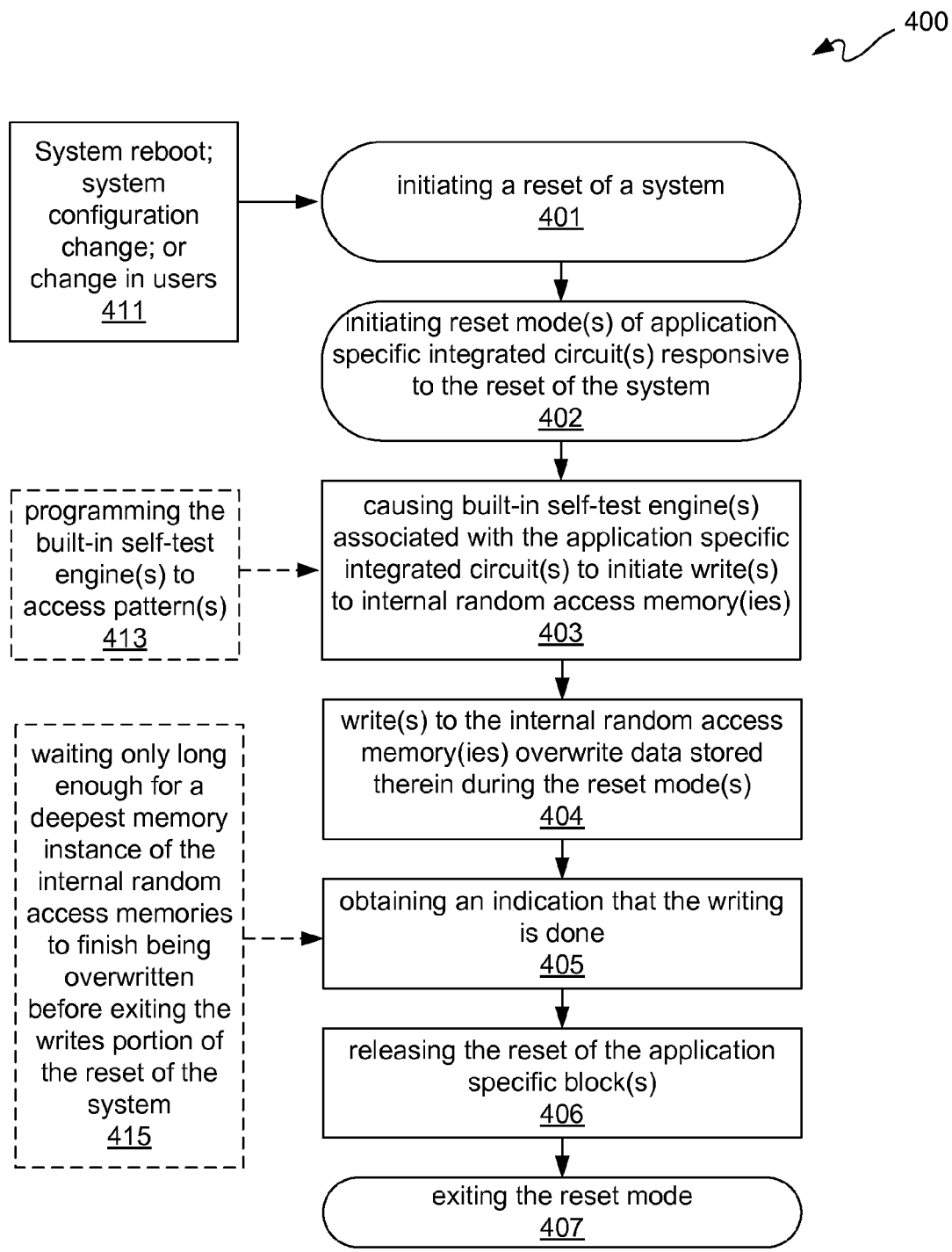
FIG. 4 is a flow diagram depicting an exemplary embodiment of a process for securing a system having an application specific integrated circuit with an internal random access memory.

FIG. 4 is a flow diagram depicting an exemplary embodiment of a process 400 for securing a system having an application specific integrated circuit with an internal random access memory. More particularly, such system may include multiple application specific integrated circuits with multiple internal random access memories.

At 401, a reset of such system is initiated. Such reset may be initiated by a system reboot, a system configuration change, or a change in users of such system as indicated at 411. However, it should be appreciated that one or more other reasons for initiating a system reset at 401 may be used. At 402, reset mode(s) of application specific integrated circuit(s) are initiated responsive to the reset of such system at 401. At 403, BIST engine(s) associated with such application specific integrated circuit(s) are caused to initiate write(s) to internal random access memory(ies).

At 404, write(s) to internal random access memory(ies) overwrite data stored in such internal random access memory (ies) during the such reset mode(s). Thus it should be understood that a system may have multiple integrated circuit chips. These multiple integrated circuit chips may represent multiple application specific integrated circuits, whether stand alone circuits or embedded cores. Thus, there may be multiple reset modes being performed across a motherboard or other circuit board having multiple integrated circuits within a system. Along those lines, there may be multiple circuit boards within a system.

At 405, an indication that the writing performed at 404 is completed is obtained. Optionally, at 415, process 400 may be configured to wait only long enough for a deepest memory instance of the internal random access memories to finish being overwritten before exiting the writes portion of the reset of such a system. In other words, once a done signal is obtained from a BIST engine associated with a deepest internal RAM that may be sufficient. In other embodiments, process 400 may be configured to wait until all BIST engines performing writes have asserted their done signals. At 406, a release of a reset or reset mode of application specific block(s) is performed. At 407, such reset mode is exited.

Accordingly, it should be understood that process 400 may include a microprocessor as an application specific integrated circuit located on a motherboard in a computer. Furthermore, such motherboard may include a host integrated circuit chip having an application specific integrated circuit core embedded as a block therein. As previously described, the BIST engine may be internal to the application specific integrated circuit, or may be internal to a host integrated circuit chip but not internal to an application specific integrated circuit core embedded in such host.

Figure 5:
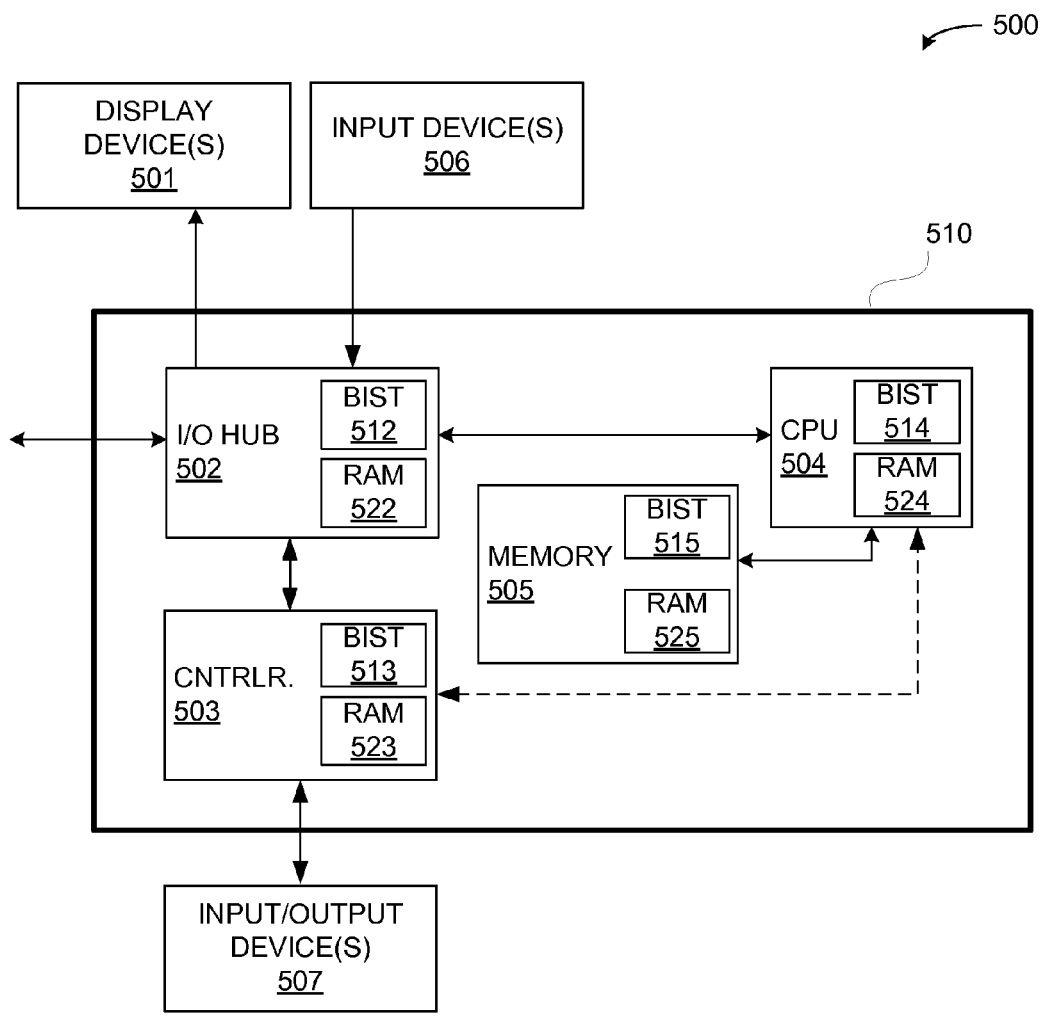
FIG. 5 is a block diagram depicting an exemplary embodiment of a system.

FIG. 5 is a block diagram depicting an exemplary embodiment of a system 500. System 500 may include one or more display devices 501, one or more input devices 506, one or more input/output devices 507, and one or more circuit boards 510. One or more circuit boards 510 may include a CPU 504, an I/O hub 502, memory 505, and a controller 503. CPU 504 may include a BIST engine 514 and internal RAM 524. I/O hub 502 may include BIST engine 512 and internal RAM 522. Memory 505 may include BIST engine 515 and internal RAM 525. Controller 503 may include BIST engine 513 and internal RAM 523. Controller 503 may be a host integrated circuit chip, such as integrated circuit 200 of FIG. 2. Upon reset of system 500, BIST engines 512 through 515 may be respectively initiated to cause writes to internal RAMs 522 through 525 to "clean" system 500 for reasons of security.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

What is claimed is:
1. A method of enhancing security of internal memory of an application specific block, comprising:
  operating the application specific block in a functional mode;
  initiating a reset of the application specific block;

initiating from a built-in self-test engine at least one write to the internal memory in response to the reset initiated; and wherein the at least one write overwrites data stored in the internal memory during a reset mode.

2. The method according to claim 1, wherein the internal memory is internal random access memory and the at least one write is a sequence of writes, and further comprising:

obtaining an indication that the sequence of writes is completed;

releasing the reset of the application specific block; and exiting the reset mode.

3. The method according to claim 2, wherein the sequence of writes during the reset mode uses paths associated with the functional mode.

4. The method according to claim 1, wherein:

the at least one write to the internal memory is of a pattern.

5. The method according to claim 4, wherein the built-in self-test engine is a memory built-in self-test engine having access to a predefined group of patterns including the pattern.

6. The method according to claim 4, further comprising programming the built-in self-test engine to access the pattern.

7. The method according to claim 1, wherein the at least one write writes at least either all data ones or zeroes to all memory cells of the internal memory.

8. A method for securing a system having an application specific integrated circuit with an internal memory, comprising:

initiating a reset of the system;

initiating a reset mode of the application specific integrated circuit responsive to the reset of the system;

initiating, by a built-in self-test engine associated with the application specific integrated circuit, writes to the internal memory; and wherein the writes overwrite data stored in the internal memory during the reset mode.

9. The method according to claim 8, wherein:

the system includes application specific integrated circuits with internal memories;

the initiating of the reset of the system causes the application specific integrated circuits to enter respective reset modes causing associated built-in self-test engines to initiate the writes to the internal memories; and during the reset modes, the writes to the internal memories overwrite data stored in the internal memories.

10. The method according to claim 9, further comprising:

waiting for a deepest memory instance of the internal memories to finish being overwritten before exiting the writes portion of the reset of the system; and wherein the internal memories are internal random access memories.

11. The method according to claim 8, wherein the reset of the system is caused by an event selected from a group consisting of a change in users of the system and a change in configuration of the system.

12. The method according to claim 8, wherein the reset of the system is caused by a reboot of the system.

13. The method according to claim 8, wherein the application specific integrated circuit is a microprocessor.

14. The method according to claim 8, wherein the application specific integrated circuit is a block in a host integrated circuit chip.

15. The method according to claim 14, wherein the built-in self-test engine is internal to the application specific integrated circuit.

16. The method according to claim 14, wherein the built-in self-test engine is not internal to the application specific integrated circuit but is internal to the host integrated circuit chip.

17. An integrated circuit, comprising:

an application specific integrated circuit block having internal memory;

a built-in self-test engine coupled to the internal memory;

a reset block coupled to the application specific integrated circuit block and the built-in self-test engine; and wherein the reset block causes the built-in self-test engine to overwrite data in the internal memory in a reset mode.

18. The integrated circuit according to claim 17, wherein:

the built-in self-test engine is internal to the application specific integrated circuit block; and the internal memory is internal random access memory.

19. The integrated circuit according to claim 17, wherein the built-in self-test engine includes a write pattern for overwriting the data.

20. The integrated circuit according to claim 17, wherein the internal memory is unmapped memory.

* * * * *